US011775172B1

(12) United States Patent
Kim et al.

(10) Patent No.: US 11,775,172 B1
(45) Date of Patent: Oct. 3, 2023

(54) GENOME DATA COMPRESSION AND TRANSMISSION METHOD FOR FASTQ-FORMATTED GENOME DATA

(71) Applicant: CELLGENTEK Corp., Cheongju-si (KR)

(72) Inventors: Hoi Yul Kim, Sejong-si (KR); Dong Woo Kim, Cheongju-si (KR); Sung Ryul Oh, Cheongju-si (KR); Young-Joon Kim, Seoul (KR); Jin-Young Lee, Ansan-si (KR)

(73) Assignee: CELLGENTEK CORP., Cheongju-si (KR)

( * ) Notice: Subject to any disclaimer, the term of this patent is extended or adjusted under 35 U.S.C. 154(b) by 0 days.

(21) Appl. No.: 17/737,120

(22) Filed: May 5, 2022

(51) Int. Cl.
G06F 3/06 (2006.01)
H03M 7/46 (2006.01)
H03M 7/30 (2006.01)

(52) U.S. Cl.
CPC .......... *G06F 3/0608* (2013.01); *G06F 3/0655* (2013.01); *G06F 3/0673* (2013.01); *H03M 7/46* (2013.01); *H03M 7/70* (2013.01)

(58) Field of Classification Search
CPC .... G06F 3/0608; G06F 3/0655; G06F 3/0673; G06F 16/1744; G06F 16/116; H03M 7/70; H03M 7/46; H03M 7/30
(Continued)

(56) References Cited

U.S. PATENT DOCUMENTS

| | | | | |
|---|---|---|---|---|
| 11,527,307 | B2 * | 12/2022 | Rizk | H03M 7/6029 |
| 2018/0365260 | A1 * | 12/2018 | Liu | G16B 20/20 |
| 2021/0058378 | A1 * | 2/2021 | Bursell | G06Q 20/382 |

FOREIGN PATENT DOCUMENTS

KR 1020020040406 A 5/2002

OTHER PUBLICATIONS

Yuting Xing et al., "GTZ: a fast compression and cloud transmission tool optimized for FASTQ files", BMC Bioinformatics, 18(Suppl 16):549, Sep. 2017, pp. 233-242.

* cited by examiner

*Primary Examiner* — Hashem Farrokh
(74) *Attorney, Agent, or Firm* — Rabin & Berdo, P.C.

(57) ABSTRACT

Provided is a genome data compression method of compressing FASTQ-formatted genome data, the method including: storing, by a first core that is one of the M cores, fixed header data in the first line of the first piece of sequence data in a compression result storage; and allocating, by the first core, N (N is a natural number of 2 or greater) pieces of the sequence data to each of the other M-1 (M is a natural number of 4 or greater) cores (hereinafter, referred to as "the remaining cores"), and performing compression by each of the remaining cores to compress N*(M-1) pieces of the sequence data together in parallel processing, and storing a compression result in the compression result storage, wherein the compression performed by each of the remaining cores is performed, including: primary compression in which for the N pieces of the sequence data, a process of the following stages for each piece of the sequence data is repeated: a stage in which a fixed header in the first line is removed; a stage in which the second line is encoded; a stage in which an identifier in the third line is stored; and a stage in which run-length encoding is performed on the fourth line; and secondary compression in which a result of the primary compression of the N pieces of the sequence data is compressed according to a lossless compression algorithm.

6 Claims, 3 Drawing Sheets

(58) Field of Classification Search
USPC .......................................................... 711/154
See application file for complete search history.

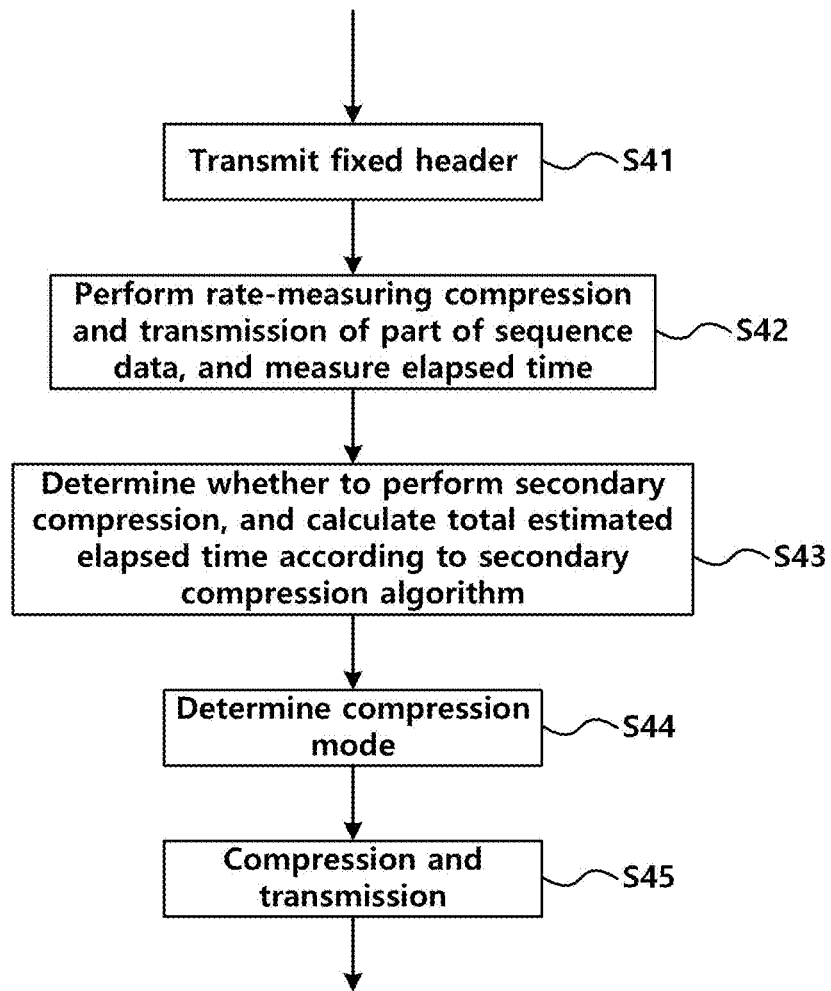

GENOME DATA COMPRESSION AND TRANSMISSION METHOD FOR FASTQ-FORMATTED GENOME DATA

BACKGROUND OF THE INVENTION

Field of the Invention

The present disclosure relates to a genome data compression and transmission method of compressing and storing FASTQ-formatted genome data, or compressing and transmitting the same.

Description of the Related Art

A gene refers to the minimum unit responsible for cell function, that is, the minimum unit with bases for transcription (translation) of a protein. Herein, the bases correspond to letters of the English alphabet constituting a sentence, and there are four bases, adenine (A), thymine (T), guanine (G), and cytosine (C).

A technology for determining the sequence of combined bases A, T, G, and C constituting a gene is called DNA sequencing. Sanger Sequencing used in the human genome project (HGP) was common, but now next-generation sequencing (NGS) is common. Third-generation sequencing methodologies, such as single molecule sequencing, nanopore sequencing, etc., have been proposed.

Examples of personal genetic information sequencing include whole-genome sequencing (WGS), whole-exome sequencing (WES), etc. For WGS, the amount of genome data of one person is massive, reaching 130 GB. Most of the data are stored in FASTQ format, a text-based format composed of ASCII codes.

Since genome data of one person reaches 130 GB, a compression technology is essential for data storage or transmission. Accordingly, various compression techniques for genome data have been proposed, but the techniques are not optimized for the characteristics of genome data and a modern computing environment and compression (decompression) takes a long time.

In addition, genome data needs to be transmitted for use, but a simple transmission process or a process of compression, transmission, and decompression takes a long time.

Although the problems with the related art have been described, recognition of the problems is not obvious to those skilled in the art to which the present disclosure pertains.

Document of Related Art (Patent Document 1) Korean Patent Application Publication, published 30 May 2002, "METHOD OF COMPRESSING AND STORING DATA BASED ON GENETIC CODE"

SUMMARY OF THE INVENTION

The present disclosure is directed to providing a method of compressing FASTQ-formatted genome data and a method of compressing and transmitting the same, the methods being optimized for characteristics of genome data and a modern computing environment.

In addition, the present disclosure is directed to providing a method of compressing FASTQ-formatted genome data and a method of compressing and transmitting the same, the methods being capable of reducing the time taken for compression and transmission.

According to one aspect of the present disclosure, there is provided a genome data compression method of compressing FASTQ-formatted genome data by a processor with M cores, the method including:

storing, by a first core that is one of the M cores, fixed header data in the first line of the first piece of sequence data in a compression result storage; and allocating, by the first core, N (N is a natural number of 2 or greater) pieces of the sequence data to each of the other M-1 (M is a natural number of 4 or greater) cores (hereinafter, referred to as "the remaining cores"), and performing compression by each of the remaining cores to compress N*(M-1) pieces of the sequence data together in parallel processing, and storing a compression result in the compression result storage, wherein the compression performed by each of the remaining cores is performed, including: primary compression in which for the N pieces of the sequence data, a process of the following stages for each piece of the sequence data is repeated, a stage in which a fixed header in the first line is removed, a stage in which the second line is encoded, a stage in which an identifier in the third line is stored, and a stage in which run-length encoding is performed on the fourth line; and secondary compression in which a result of the primary compression of the N pieces of the sequence data is compressed according to a lossless compression algorithm.

In the genome data compression method of compressing the FASTQ-formatted genome data, a 7 z compression algorithm may be applied in the secondary compression. In the genome data compression method of compressing the FASTQ-formatted genome data, the second line may be encoded by mapping letters A, T, G, and C to 2-bit codes according to a preset mapping table.

According to another aspect of the present disclosure, there is provided a genome data compression and transmission method of compressing FASTQ-formatted genome data by a transmitter including a processor with M cores, and of transmitting a compression result to a receiver, the method including: allocating, by a first core that is one of the M cores, N (N is a natural number of 2 or greater) pieces of sequence data to each of the other M-1 (M is a natural number of 4 or greater) cores (hereinafter, referred to as "the remaining cores"), and performing compression by each of the remaining cores to compress N*(M-1) pieces of the sequence data together in parallel processing, wherein the compression performed by each of the remaining cores is performed, including: primary compression in which for the N pieces of the sequence data, a process of the following stages for each piece of the sequence data is repeated: a stage in which a fixed header in the first line is removed; a stage in which the second line is encoded; a stage in which an identifier in the third line is stored; and a stage in which run-length encoding is performed on the fourth line.

In the genome data compression and transmission method of compressing the FASTQ-formatted genome data, in the compression performed by each of the remaining cores, secondary compression in which a result of the primary compression of the N pieces of the sequence data may be compressed according to at least one lossless compression algorithm may be optionally performed.

The genome data compression and transmission method of compressing the FASTQ-formatted genome data may further include: transmitting, by the first core, fixed header data in the first line of the first piece of the sequence data to the receiver; performing, by the transmitter, the primary compression on S (S is a natural number of 1 or greater) pieces of the sequence data of the genome data to transmit a result of the primary compression to the receiver so that the receiver performs decompression, and performing the secondary compression to transmit a result of the secondary compression to the receiver so that the receiver performs decompression corresponding to the secondary compression, the transmitter performing rate-measuring compression and transmission performed for each of the at least one lossless compression algorithm; determining, by the first core of the transmitter according to a result of rate-measuring compression and transmission, whether to perform the secondary compression to be applied to the remaining sequence data (hereinafter, referred to as "main sequence data") excluding the S pieces of the sequence data, and determining the lossless algorithm to be applied to the secondary compression, thereby determining a compression technique for the main sequence data; and performing compression by the other M-1 cores according to the compression technique determined for the main sequence data, and transmitting the compression result to the receiver.

In the genome data compression and transmission method of compressing the FASTQ-formatted genome data, in the determining of the compression technique for the main sequence data, by using the result of rate-measuring compression and transmission, for each of the following modes: a compression and transmission mode in which the primary compression is performed and the secondary compression is not performed; and a compression and transmission mode in which the primary compression is performed and the secondary compression is performed according to the at least one lossless compression algorithm that is a candidate, total estimated elapsed time taken for compression, transmission, and decompression at the transmitter and the receiver, is calculated, and the compression and transmission mode with the shortest total estimated elapsed time is determined as the compression technique for the main sequence data.

According to the genome data compression method of the present disclosure, genome data which is large in amount is effectively compressed to occupy less space in the storage, and high-rate transmission can be achieved. In particular, since genome data sequencing technologies including NGS have been actually used recently, the present disclosure can be used as a base technology therefor.

In addition, according to the genome data compression method of the present disclosure, an algorithm structure facilitating application of multi-core processing (parallel computing) can achieve a high compression ratio and greatly reduce the time taken for compression.

In addition, according to the genome data compression and transmission method of the present disclosure, the measurement and calculation of the total estimated time can be facilitated, and further, it can be achieved that the estimated total elapsed time is very close to the actual elapsed time for the remaining sequence data. In addition, it is easy to implement additional application or non-application of existing common lossless compression algorithms, and select an optimum lossless compression algorithm.

BRIEF DESCRIPTION OF THE DRAWINGS

The above and other objectives, features, and other advantages of the present disclosure will be more clearly understood from the following detailed description when taken in conjunction with the accompanying drawings, in which:

FIGS. 2 and 3 are flowcharts showing a genome data compression method performed by a server or a PC having a multi-core processor according to a first exemplary embodiment of the present disclosure, wherein FIG. 2 shows a process performed by any one core, and FIG. 3 shows a process performed by the other cores;

FIG. 4 is a flowchart showing a genome data compression and transmission method of compressing FASTQ-formatted genome data by a transmitter having a processor with M cores and of transmitting a compression result to a receiver according to a second exemplary embodiment of the present disclosure; and FIG. 5 is a table showing experimental result data according to an experimental example of genome data compression without parallel processing, for example, by a single core of a computer.

DETAILED DESCRIPTION OF THE INVENTION

Figure 1:
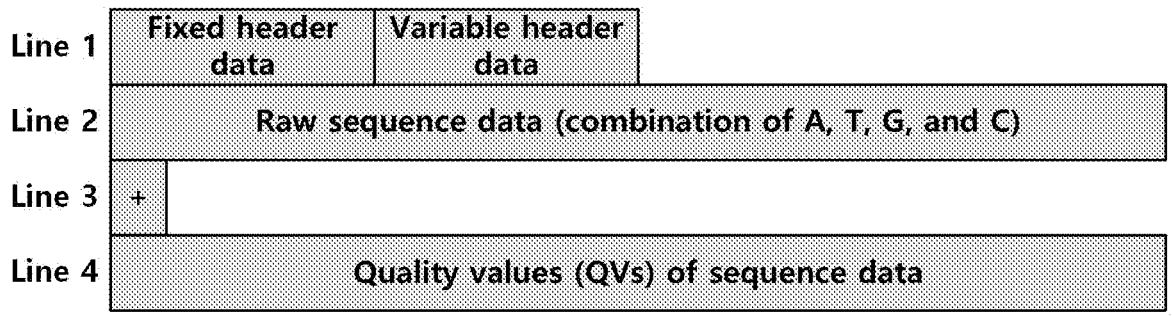
FIG. 1 is a view showing a FASTQ-formatted sequence data structure.

Hereinbelow, exemplary embodiments of the present disclosure will be described in detail with reference to the accompanying drawings such that the present disclosure can be easily embodied by those skilled in the art to which this present disclosure pertains. However, the present disclosure may be embodied in various different forms and should not be limited to the embodiments set forth herein. Further, in order to clearly describe the present disclosure, elements that are not related to the present disclosure are omitted in the drawings, and similar names and similar reference numerals denote similar elements throughout the specification. FIG. 1 is a view showing a FASTQ-formatted sequence data structure.

In each piece of sequence data, the first line (Line 1) includes fixed header data and variable header data. For example, the first line may be expressed as "@HWUSI-EAS100R:6:73:941:1973#0/1".

The "HWUSI-EAS100R" denotes the unique instrument name. The "6" denotes a flowcell lane. The "73" denotes the tile number within the flowcell lane. The "941" denotes the "x"-coordinate of the cluster within the tile. The "1973" denotes the "y"-coordinate of the cluster within the tile. The "#0" denotes the index number for a multiplexed sample (0 for no indexing). The "/1" denotes the member of a pair(/1 or /2; paired-end or mate-pair reads only).

The second line (Line 2) of the sequence data is actual sequence data (raw sequence data), and is text data in which four letters A, T, G, and C are repeated. For example, the second line may be expressed as "GATTTGGGGTT-CAAAGCAGTATCGATCAAATAGTAAATCCATTTGTT-CAACTCACAGTTT".

The third line (Line 3) is a 1-byte identifier "+". The fourth line (Line 4) is quality values (QVs) of the sequence data, and is expressed as, for example, "!"*((((*+)) %%%++)                 (%%%%).1*−+*")) **55CCF>>>>>>CCCCCCC65".

The present disclosure relates to a method of compressing and storing an FASTQ-formatted genome data file, or compressing and transmitting the same. The compression method may be performed by a server, a workstation, or a PC. Further, the compression method may be performed by a server, workstation, or a PC having a micro processor with multiple cores. In addition, the compressed genome data file may be transmitted therebetween through a communication network, such as the Internet.

Figure 2:
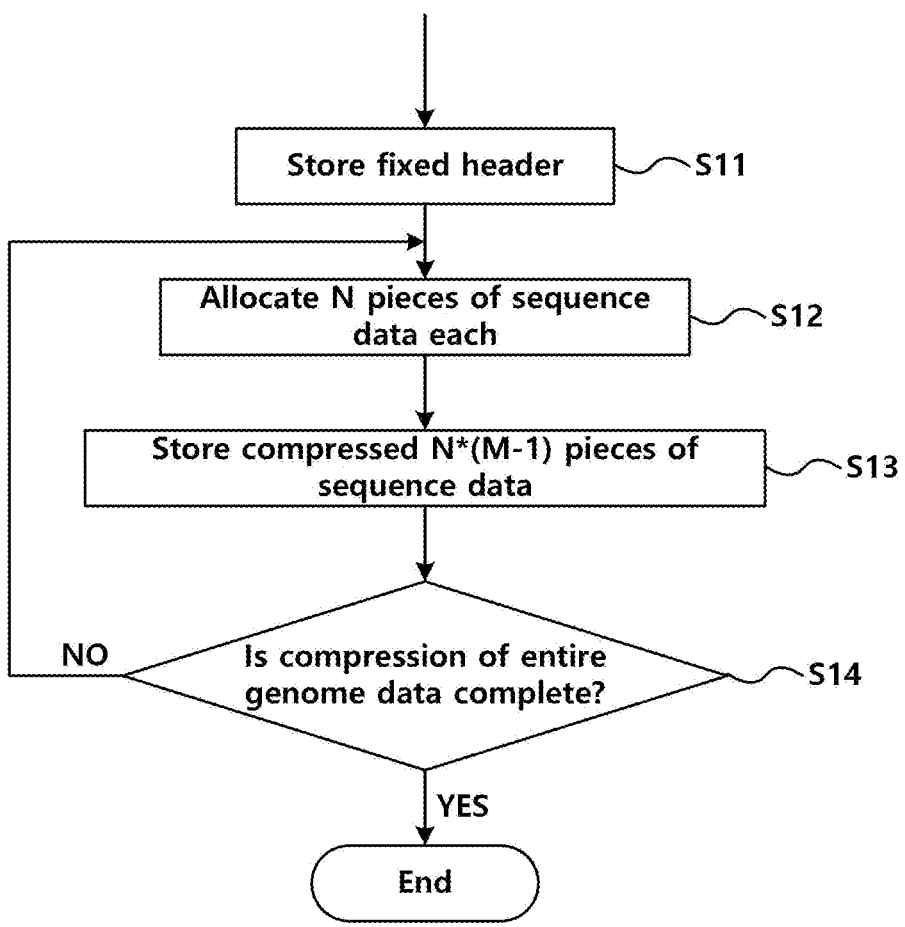
Figure 3:
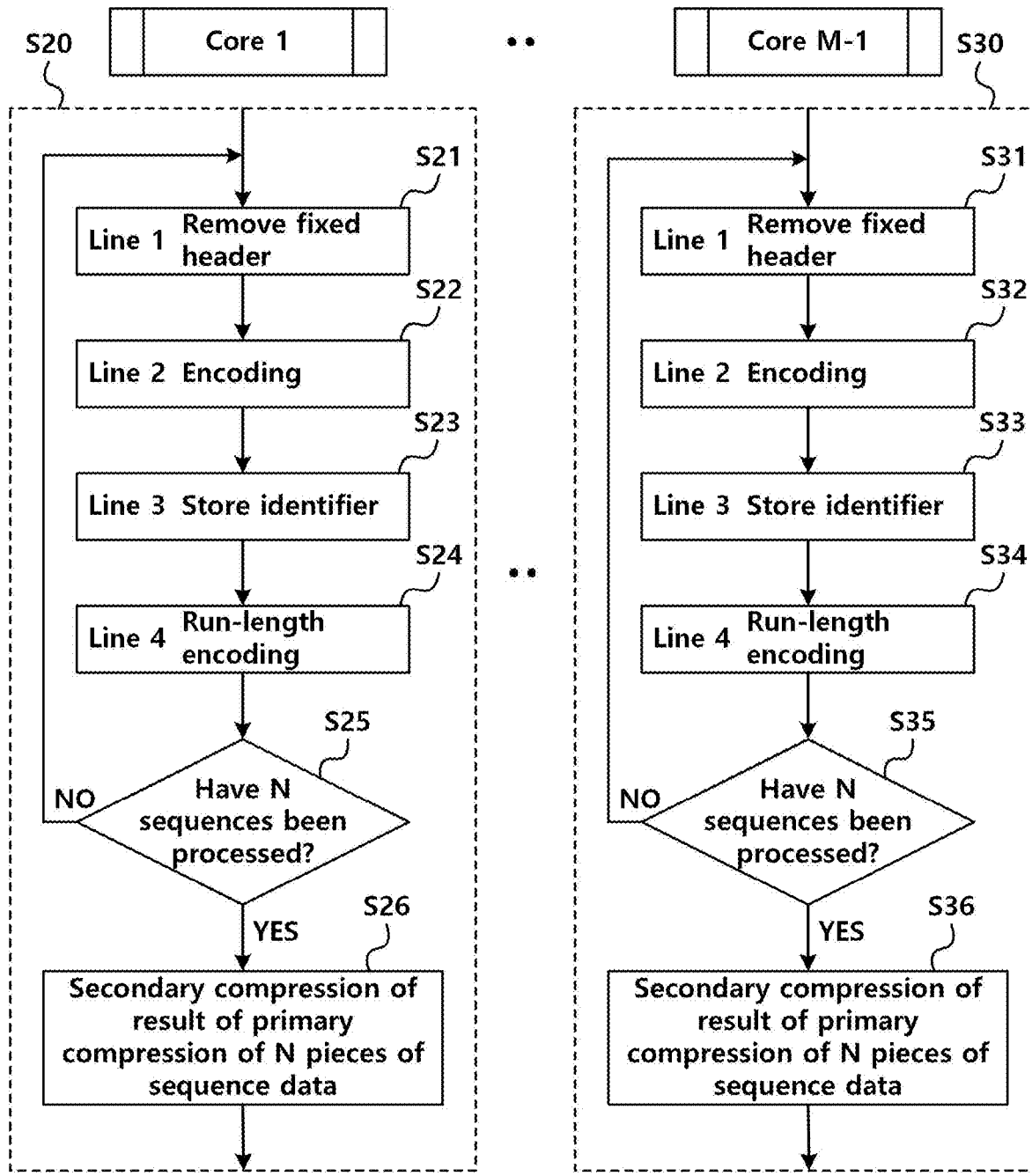

FIGS. 2 and 3 are flowcharts showing a genome data compression method performed by a server or a PC having a multi-core processor according to a first exemplary embodiment of the present disclosure, wherein FIG. 2 shows a process performed by any one core, and FIG. 3 shows a process performed by the other cores.

For example, in a processor with M cores, in order to compress FASTQ-formatted genome data, one (hereinafter, also referred to as a "first core") of the M cores performs the process shown in FIG. 2, and the other M-1 (M is a natural number of 4 or greater) cores (hereinafter, also referred to as "the remaining cores") excluding the first core perform the process shown in FIG. 3. Hereinafter, in order to focus on the matters for describing the embodiments of the present disclosure, a description of other incidental matters may be omitted.

First, the first core stores fixed header data in the first line (Line 1) of the first piece of sequence data among a lot of sequence data, in a compression result storage in step S11. Next, the first core allocates N (N is a natural number of 2 or greater) pieces of sequence data to each of the remaining cores in step S12. Similarly, as an equivalent thereof, it is considered that each core reads N pieces of sequence data in order. The N pieces of sequence data allocated (distributed) to each of the remaining cores are subjected to a compression process shown in FIG. 3. The first core allocates N pieces of sequence data to each of the other M-1 cores so that the N pieces of sequence data are compressed by each of the remaining cores.

Accordingly, the processor compresses N*(M-1) pieces of sequence data together in parallel processing, and stores a compression result by the remaining cores in the compression result storage in step S13. The first core or each of the remaining cores store the compression result in the compression result storage, so that the compressed N*(M-1) pieces of sequence data are stored in step S13.

With reference to FIG. 3, the compression process performed by each of the remaining cores will be described in detail. With respect to each piece of sequence data, the fixed header data is removed in step s21 or S31, and the variable header data is left as it is, regarding data in the first line (Line 1). Afterward, in decompression, the fixed header data of each piece of sequence data is reconstructed using the fixed header data of the first piece of the sequence data stored by the first core.

The raw sequence data (or also called raw sequence letters) in the second line (Line 2) is encoded in step S22 or S32. The encoding is performed by mapping the letters A, T, G, and C to 2-bit codes according to a preset mapping table. Accordingly, 1-byte (8-bit) data becomes 2-bit data. The mapping table is a table that defines 2-bit codes corresponding to the letters A, T, G, and C. Afterward, in decompression, the mapping table is used to reconstruct the letters corresponding to 2-bit codes. The identifier in the third line is left as it is, and stored in step S23 or S33. The QV data in the fourth line is compressed by applying run-length encoding in step S24 or S34.

By repeating the above-described process for one piece of sequence data, N pieces of sequence data are compressed. For example, it is determined whether processing of the N sequences is completed, in step S25 or S35. When the processing is not completed, processing starting from the next first line to the next fourth line is performed. When the processing is completed, primary compression is finished and secondary compression is performed.

Secondary compression is performed by applying a lossless compression algorithm to the result data of primary compression of the N pieces of sequence data in step S26. For secondary compression, a 7 zip (7 z) compression algorithm is applied.

The above processes are performed by each of the M-1 cores, and compression result data from each of the cores is stored in the compression result storage. In this manner, allocation to the remaining cores and compression are repeated. The first core determines whether compression of the entire genome data file is completed, in step S14. When compression is not completed, steps S12 to S14 are repeated so that compression is performed on all the pieces of sequence data of the genome data file.

FIG. 5 is a table showing experimental result data according to an experimental example of genome data compression without parallel processing, for example, by a single core of a computer.

In the first column of FIG. 5, the compression method cfc shows an example in which the entire genome data was compressed by repeatedly performing only the above-described primary compression (steps S21 to S24) for each piece of sequence data. The compression method 7 z shows an example in which the same genome data was compressed by applying only the 7 z compression algorithm. The compression method 7 z [cfc] shows an example in which on condition that there was a result obtained through the compression method cfc, secondary compression (the 7 z compression algorithm) was performed on the result. The compression method cfc+7 z shows an example of a result of performing both primary compression and secondary compression.

As shown in FIG. 5, the case of compression using only the 7 z had a higher compression ratio than the compression method cfc (a technique using only primary compression), but took about 7 hours for compression, taking a longer time than 35 minutes for the cfc. In other words, compared to the 7 z having the currently highest compression ratio and rate, the compression method cfc was absolutely advantageous because it greatly reduced the time taken for compression, but had a weak point in terms of storage space or transmission traffic due to its post-compression size close to three times as large as that of the 7 z.

In the meantime, the compression method cfc+7 z, which is a combination of primary compression and secondary compression applied to the embodiment of the present disclosure, took a longer time than the compression method cfc, but reduced the time taken for compression compared to the compression method 7 z. In particular, the compression method cfc+7 z was better than the compression method 7 z in terms of both the time taken for compression and a compression ratio.

Further, the compression method cfc+7 z of the experimental example using a single core still has a problem because it was difficult to greatly reduce the time taken for compression. However, as shown in FIGS. 2 and 3, the compression method according to the embodiment of the present disclosure is an algorithm designed to facilitate the application of multi-core processing, so performing multi-core processing reduces the operation time to about 1/(M-1). For example, the use of an 8-core processor reduces the time taken for compression to about 1/7. Compared to the conventional genome data compression method, the genome data compression method according to the embodiment of the present disclosure is very easily applied to multi-core processing.

FIG. 4 is a flowchart showing a genome data compression and transmission method of compressing FASTQ-formatted genome data by a transmitter having a processor with M cores and of transmitting a compression result to a receiver according to a second exemplary embodiment of the present disclosure.

The transmitter compresses genome data and transmits the compressed genome data to the receiver. The receiver receives and decompresses the compressed genome data. The transmitter and the receiver may be servers, workstations, or PCs.

The transmitter transmits, to the receiver, fixed header data in the first line of the first piece of sequence data of genome data under the control of (a first core of) the processor of the transmitter in step S41, for example. This step may be moved to the point before or after any one of steps S42 to S45.

Next, the transmitter performs the primary compression on S (S is a natural number of 1 or greater) pieces of sequence data of the genome data to transmit a result of the primary compression to the receiver, and the receiver performs decompression. The transmitter performs the secondary compression on the result data of primary compression to transmit a result of the secondary compression to the receiver, and the receiver performs decompression corresponding to the secondary compression, which is performed for each of a plurality of (one or more) lossless compression algorithms. Accordingly, rate-measuring compression and transmission is performed and the elapsed time is measured in step S42. That is, a result of performing only primary compression and results of performing primary compression and secondary compression according to the respective lossless compression algorithms are transmitted to measure the total elapsed time for each of the results. For example, the transmitter may independently measure the time taken for compression and transmission, and may receive a report on the time taken for decompression measured by the receiver. For example, the plurality of lossless compression algorithms may be a group of all or some of ZIP, RAR, 7 z, GZ, BZ2, ALZ, EGG, Raw, LHA, ARJ, ACE, etc.

According to a result of rate-measuring compression and transmission, it is determined whether to perform secondary compression to be applied to the remaining sequence data (hereinafter, referred to as "main sequence data") excluding the S pieces of sequence data for measurement, and the lossless algorithm to be applied to secondary compression is determined, thereby determining a compression technique for the main sequence data.

Using the result of rate-measuring compression and transmission, the transmitter, e.g., the first core of the transmitter, calculates the total estimated elapsed time for compression, transmission, and decompression at the transmitter and the receiver in step S43 for each of the following modes: a compression and transmission mode in which the primary compression described with reference to FIG. 3 is performed, but the secondary compression is not performed; and a compression and transmission mode in which the primary compression is performed and the secondary compression is performed according to at least one lossless compression algorithm, which is a candidate. The transmitter determines the compression and transmission mode with the shortest total estimated elapsed time as a compression technique for main sequence data in step S44.

Next, according to the compression technique determined for the main sequence data, the other cores perform compression as shown in FIG. 3, and a compression result is transmitted to the receiver.

Regarding compression at the transmitter, the first core, which is one of the M cores, allocates N (N is a natural number of 2 or greater) pieces of sequence data to each of the other M-1 (M is a natural number of 4 or greater) cores (hereinafter, referred to as "the remaining cores"), and the remaining cores perform compression, so that N*(M-1) pieces of sequence data are compressed together in parallel processing. Herein, the compression performed by each of the remaining cores includes, as described above with reference to FIG. 3, a process of the following stages for each piece of sequence data: a stage in which a fixed header in the first line is removed in step S21 or S31 and a variable header is stored or left as it is; a stage in which the second line is encoded in step S22 or S32; a stage in which an identifier in the third line is left as it is, or stored in step S23 or S33; and a stage in which run-length encoding is performed on the fourth line in step S24 or S34. The compression is performed, including the primary compression in which these stages are repeated for N pieces of sequence data.

Next, on the result of the primary compression of the N pieces of sequence data, secondary compression according to the determined lossless compression algorithm is performed optionally.

According to the second exemplary embodiment of the present disclosure, secondary compression is optionally (dynamically) performed depending on a situation. For example, in an environment or situation in which a transmission rate through communication is low, it is determined to perform both primary and secondary compression as a compression technique in step S44. In the case of a low transmission rate, further compression and transmission is performed to reduce the total elapsed time. However, when the transmission rate is equal to or higher than a predetermined level, it is determined to perform only primary compression because an increased time period caused by secondary compression and decompression will be longer than a decreased time period for transmission. According to the embodiment of the present disclosure, the determination is performed automatically.

The genome data compression and transmission method according to the present disclosure facilitates the measurement and calculation of the total estimated time described above, and achieves a result that the estimated total elapsed time is very close to the actual total elapsed time for the remaining sequence data. Further, the genome data compression and transmission method according to the present disclosure makes it easy to implement additional application or non-application of existing common lossless compression algorithms, and facilitates selecting an optimum lossless compression algorithm.

Although a preferred embodiment of the present disclosure has been described for illustrative purposes, those skilled in the art will appreciate that various modifications, additions and substitutions are possible, without departing from the scope and spirit of the disclosure as disclosed in the accompanying claims.

What is claimed is:

1. A genome data compression method of compressing FASTQ-formatted genome data by a processor with M cores, the method comprising:
   storing, by a first core that is one of the M cores, fixed header data in the first line of the first piece of sequence data in a compression result storage; and
   allocating, by the first core, N (N is a natural number of 2 or greater) pieces of the sequence data to each of the other M-1 (M is a natural number of 4 or greater) cores (hereinafter, referred to as "the remaining cores"), and performing compression by each of the remaining cores to compress N*(M-1) pieces of the sequence data together in parallel processing, and storing a compression result in the compression result storage,
wherein the compression performed by each of the remaining cores is performed, including:
primary compression in which for the N pieces of the sequence data, a process of the following stages for each piece of the sequence data is repeated: a stage in which a fixed header in the first line is removed; a stage in which the second line is encoded; a stage in which an identifier in the third line is stored; and a stage in which run-length encoding is performed on the fourth line; and
secondary compression in which a result of the primary compression of the N pieces of the sequence data is compressed according to a lossless compression algorithm.

2. The method of claim 1, wherein in the secondary compression, a 7 z compression algorithm is applied.

3. The method of claim 1, wherein the second line is encoded by mapping letters A, T, G, and C to 2-bit codes according to a preset mapping table.

4. A genome data compression and transmission method of compressing FASTQ-formatted genome data by a transmitter including a processor with M cores, and of transmitting a compression result to a receiver, the method comprising:
allocating, by a first core that is one of the M cores, N (N is a natural number of 2 or greater) pieces of sequence data to each of the other M-1 (M is a natural number of 4 or greater) cores (hereinafter, referred to as "the remaining cores"), and performing compression by each of the remaining cores to compress N*(M-1) pieces of the sequence data together in parallel processing,
wherein the compression performed by each of the remaining cores is performed, including primary compression in which for the N pieces of the sequence data, a process of the following stages for each piece of the sequence data is repeated: a stage in which a fixed header in the first line is removed; a stage in which the second line is encoded; a stage in which an identifier in the third line is stored; and a stage in which run-length encoding is performed on the fourth line, and
in the compression performed by each of the remaining cores, secondary compression in which a result of the primary compression of the N pieces of the sequence data is compressed according to at least one lossless compression algorithm is optionally performed.

5. The method of claim 4, further comprising:
transmitting, by the first core, fixed header data in the first line of the first piece of the sequence data to the receiver;
performing, by the transmitter, the primary compression on S (S is a natural number of 1 or greater) pieces of the sequence data of the genome data to transmit a result of the primary compression to the receiver so that the receiver performs decompression, and performing the secondary compression to transmit a result of the secondary compression to the receiver so that the receiver performs decompression corresponding to the secondary compression, the transmitter performing rate-measuring compression and transmission performed for each of the at least one lossless compression algorithm;
determining, by the first core of the transmitter according to a result of rate-measuring compression and transmission, whether to perform the secondary compression to be applied to the remaining sequence data (hereinafter, referred to as "main sequence data") excluding the S pieces of the sequence data, and determining the lossless algorithm to be applied to the secondary compression, thereby determining a compression technique for the main sequence data; and
performing compression by the other M-1 cores according to the compression technique determined for the main sequence data, and transmitting the compression result to the receiver.

6. The method of claim 5, wherein in the determining of the compression technique for the main sequence data, by using the result of rate-measuring compression and transmission, for each of the following modes: a compression and transmission mode in which the primary compression is performed and the secondary compression is not performed; and a compression and transmission mode in which the primary compression is performed and the secondary compression is performed according to the at least one lossless compression algorithm that is a candidate, total estimated elapsed time taken for compression, transmission, and decompression at the transmitter and the receiver, is calculated, and the compression and transmission mode with the shortest total estimated elapsed time is determined as the compression technique for the main sequence data.

* * * * *